United States Patent
Kadomi et al.

(10) Patent No.: US 9,691,937 B2
(45) Date of Patent: Jun. 27, 2017

(54) LIGHT-EMITTING DEVICE MANUFACTURING METHOD

(71) Applicant: NIPPON ELECTRIC GLASS CO., LTD., Otsu-shi, Shiga (JP)

(72) Inventors: Masaaki Kadomi, Otsu (JP); Hideki Asano, Otsu (JP); Takashi Nishimiya, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 15/035,494

(22) PCT Filed: Mar. 10, 2015

(86) PCT No.: PCT/JP2015/056923
§ 371 (c)(1),
(2) Date: May 10, 2016

(87) PCT Pub. No.: WO2015/156071
PCT Pub. Date: Oct. 15, 2015

(65) Prior Publication Data
US 2016/0293795 A1    Oct. 6, 2016

(30) Foreign Application Priority Data

Apr. 11, 2014   (JP) ................. 2014-081862

(51) Int. Cl.
*H01L 33/04*   (2010.01)
*H01L 51/50*   (2006.01)
(Continued)

(52) U.S. Cl.
CPC ............. *H01L 33/04* (2013.01); *H01L 33/52* (2013.01); *H01L 51/0024* (2013.01);
(Continued)

(58) Field of Classification Search
CPC .................... H01L 2933/005; H01L 2924/181
See application file for complete search history.

(56) References Cited

U.S. PATENT DOCUMENTS

| | | | |
|---|---|---|---|
| 8,993,367 B2 * | 3/2015 | Asano | C03C 27/06 438/69 |
| 9,103,954 B2 * | 8/2015 | Asano | C03B 23/245 |

(Continued)

FOREIGN PATENT DOCUMENTS

| | | | |
|---|---|---|---|
| JP | 63-237026 A | 10/1988 | |
| JP | 11-209149 A | 8/1999 | |

(Continued)

OTHER PUBLICATIONS

Official Communication issued in International Patent Application No. PCT/JP2015/056923, mailed on May 26, 2015.

*Primary Examiner* — Jaehwan Oh
(74) *Attorney, Agent, or Firm* — Keating and Bennett, LLP

(57) ABSTRACT

Provided is a method that can manufacture a light-emitting device in which quantum dot is used and which has a high luminous efficiency. A light-emitting device (1) is manufactured that includes: a cell (10) including first and second glass plates (11, 12) facing and spaced apart from each other; and quantum dot (17) encapsulated in the cell (10). Prior to the encapsulation of the quantum dot (17), a reduction step of reducing moisture adsorbed on the inside walls of the cell (10) is performed.

7 Claims, 1 Drawing Sheet

(51) Int. Cl.
*H01L 51/00* (2006.01)
*H01L 33/52* (2010.01)
*G02B 27/00* (2006.01)
*H01L 33/50* (2010.01)

(52) U.S. Cl.
CPC ........ *H01L 51/502* (2013.01); *G02B 27/0006* (2013.01); *H01L 33/507* (2013.01); *H01L 2933/0033* (2013.01); *H01L 2933/0041* (2013.01)

(56) References Cited

U.S. PATENT DOCUMENTS

| | | | |
|---|---|---|---|
| 2009/0278141 A1* | 11/2009 | Coe-Sullivan | B82Y 20/00 257/89 |
| 2011/0012873 A1* | 1/2011 | Prest | H01L 51/5237 345/204 |
| 2011/0303940 A1* | 12/2011 | Lee | H01L 33/54 257/98 |
| 2013/0294048 A1 | 11/2013 | Asano et al. | |
| 2013/0294107 A1 | 11/2013 | Ohkawa et al. | |
| 2015/0159833 A1* | 6/2015 | Qiu | G02B 3/00 362/335 |
| 2015/0187987 A1* | 7/2015 | Sim | G02F 1/133602 257/98 |
| 2015/0219965 A1* | 8/2015 | Dong | G02F 1/133617 349/69 |

FOREIGN PATENT DOCUMENTS

| | | |
|---|---|---|
| JP | 2001-284172 A | 10/2001 |
| JP | 2012-163936 A | 8/2012 |
| JP | 2013-218954 A | 10/2013 |

\* cited by examiner

LIGHT-EMITTING DEVICE MANUFACTURING METHOD

TECHNICAL FIELD

This invention relates to a method for manufacturing a light-emitting device.

BACKGROUND ART

Light-emitting devices have heretofore been known in which quantum dot is used. Quantum dot is degraded by contact with moisture or oxygen. Therefore, in the light-emitting devices in which quantum dot is used, a cell for encapsulating the quantum dot is preferably used. For example, Patent Literature 1 describes that a glass-made cell is used for a light-emitting device in which quantum dot is used.

CITATION LIST

Patent Literature

[PTL 1]
JP-A-2012-163936

SUMMARY OF INVENTION

Technical Problem

There is demand to improve the luminous efficiency of light-emitting devices in which quantum dot is used.

The present invention consists in providing a method that can manufacture a light-emitting device in which quantum dot is used and which has a high luminous efficiency.

Solution to Problem

A method for manufacturing a light-emitting device according to the present invention is a method for manufacturing a light-emitting device that includes: a cell including first and second glass plates facing and spaced apart from each other; and quantum dot encapsulated in the cell. In the method for manufacturing a light-emitting device according to the present invention, a reduction step of reducing moisture adsorbed on inside walls of the cell is performed prior to the encapsulation of the quantum dot into the cell.

Specifically, a cell including first and second glass plates facing and spaced apart from each other is prepared. Quantum dot is introduced into the cell and then encapsulated, thus obtaining a light-emitting device including the cell and the quantum dot encapsulated in the cell. Prior to the encapsulation of the quantum dot into the cell, a reduction step of reducing moisture adsorbed on inside walls of the cell is performed.

In the method for manufacturing a light-emitting device according to the present invention, the cell is preferably heated to or above 300° C. in the reduction step.

In the method for manufacturing a light-emitting device according to the present invention, in the reduction step, the cell is preferably heated to or above 300° C. while being internally reduced in pressure.

In the method for manufacturing a light-emitting device according to the present invention, the reduction step is preferably performed under an inert gas atmosphere.

In the method for manufacturing a light-emitting device according to the present invention, after the reduction step is performed, the step of introducing the quantum dot into the cell is preferably performed without exposure to the atmosphere.

In the method for manufacturing a light-emitting device according to the present invention, the cell preferably further includes a glass-made sidewall member disposed between the first glass plate and the second glass plate.

In the method for manufacturing a light-emitting device according to the present invention, the cell is preferably produced by fusing each of the glass plates to the sidewall member.

Advantageous Effects of Invention

The present invention can provide a method that can manufacture a light-emitting device in which quantum dot is used and which has a high luminous efficiency.

DESCRIPTION OF EMBODIMENTS

Hereinafter, a description will be given of an example of a preferred embodiment for working of the present invention. However, the following embodiment is simply illustrative. The present invention is not at all limited to the following embodiment.

Figure 1:
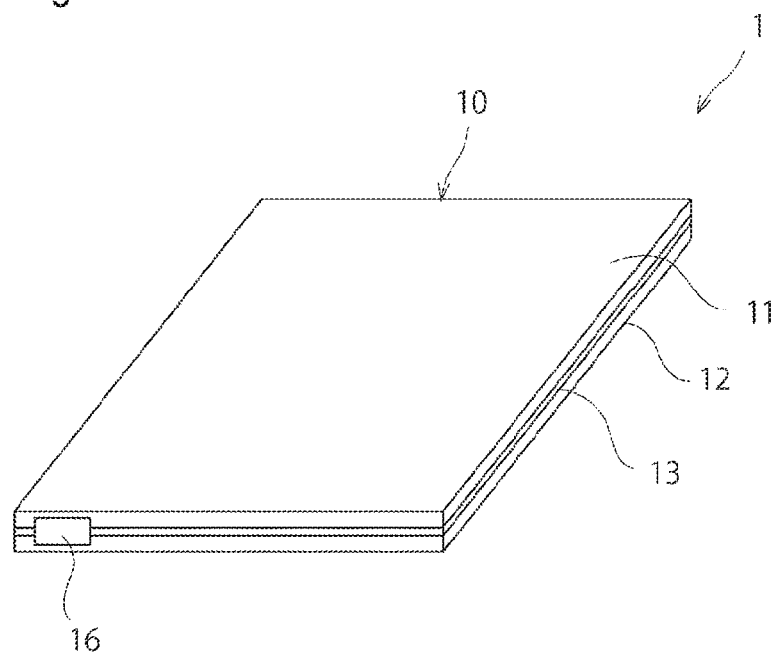
FIG. 1 is a schematic perspective view of a light-emitting device according to one embodiment of the present invention.
Figure 2:
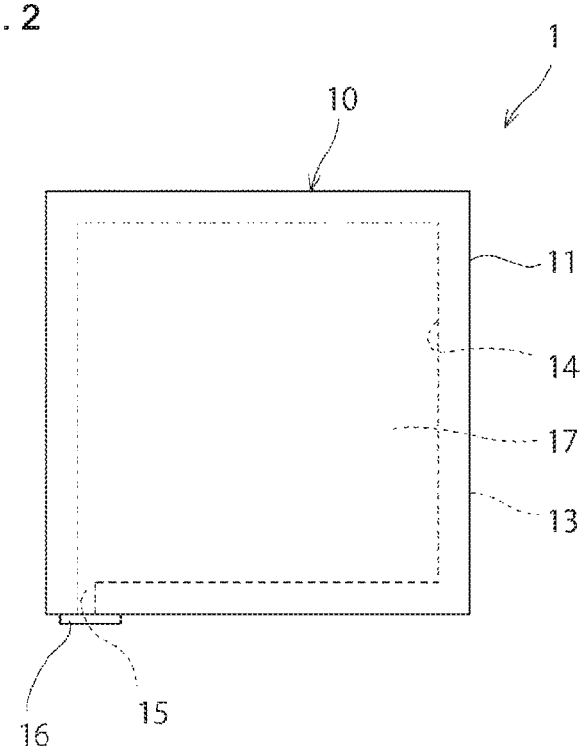
FIG. 2 is a schematic plan view of the light-emitting device according to the one embodiment of the present invention.

In this embodiment, a description will be given of a method for manufacturing a light-emitting device 1 shown in FIGS. 1 and 2.

(Structure of Light-Emitting Device 1)

The light-emitting device 1 is a device that, upon incidence of excitation light, emits light of a different wavelength from the excitation light. The light-emitting device 1 may be configured to emit mixed light of the excitation light and light produced upon irradiation with the excitation light.

The light-emitting device 1 includes a cell 10. The cell 10 includes a first glass plate 11 and a second glass plate 12. The first glass plate 11 and the second glass plate 12 face each other and are spaced apart from each other. In this embodiment, each of the first and second glass plates 11, 12 has a rectangular shape in plan view. However, the present invention is not limited to this. Each of the first and second glass plates 11, 12 may have a polygonal, circular, polycircular, oval or other shapes in plan view. Each of the first and second glass plates 11, 12 can have a thickness of, for example, about 0.1 mm to about 2 mm.

Each of the first and second glass plates 11, 12 may be formed of a crystallized glass plate.

A sidewall member 13 made of glass is disposed between the first glass plate 11 and the second glass plate 12. The sidewall member 13 is provided on peripheral edge portions of the first and second glass plates 11, 12. The sidewall member 13 is fused to each of the first and second glass plates 11, 12. This sidewall member 13 and the first and second glass plates 11, 12 define an interior space 14. The sidewall member 13 can have a thickness of, for example, about 0.1 mm to about 5 mm. The sidewall member 13 is not limited to have a frame shape and may be formed of, for example, a plurality of glass ribbons, a tubular glass or other glass structures.

The sidewall member 13 is provided with a connecting hole 15 connecting the interior space 14 with the outside. The connecting hole 15 is closed with a closure member 16. The closure member 16 can be formed of, for example, a glass sheet. When the closure member 16 is formed of a glass sheet, the closure member 16 may be fused to the glass plates 11, 12 and the sidewall member 13.

In this embodiment, a description will be given of an example where the entire cell 10 is made of glass. However, the present invention is not limited to this structure. No particular limitation is placed on the structure of the cell 10 in the present invention so long as it includes first and second glass plates 11, 12. For example, the sidewall member 13 of the cell 10 may be formed of a member made of materials other than glass.

Quantum dot 17 is encapsulated in the interior space 14 of the cell 10. A single kind of quantum dot 17 may be encapsulated in the cell 10 or a plurality of kinds of quantum dot 17 may be encapsulated in the cell 10. The quantum dot 17 may be encapsulated in the interior space 14, for example, in a state where it is dispersed in a liquid or in a state where it is dispersed in a resin.

The quantum dot 17 emits, upon incidence of excitation light for the quantum dot 17, light of a different wavelength from the excitation light. The wavelength of light emitted from the quantum dot 17 depends on the particle size of the quantum dot 17. In other words, by changing the particle size of the quantum dot 17, the wavelength of the resultant light can be controlled. Therefore, the particle size of the quantum dot 17 is selected to be a particle size meeting a desired wavelength of light. The particle size of the quantum dot 17 is generally about 2 nm to about 10 nm.

For example, specific examples of quantum dot that produces blue visible light (fluorescence of a wavelength of 440 to 480 nm) upon irradiation with ultraviolet to near-ultraviolet excitation light of a wavelength of 300 to 440 nm include CdSe nanocrystals having a particle size of about 2.0 nm to about 3.0 nm. Specific examples of quantum dot that produces green visible light (fluorescence of a wavelength of 500 nm to 540 nm) upon irradiation with ultraviolet to near-ultraviolet excitation light of a wavelength of 300 to 440 nm or blue excitation light of a wavelength of 440 to 480 nm include CdSe nanocrystals having a particle size of about 3.0 nm to about 3.3 nm. Specific examples of quantum dot that produces yellow visible light (fluorescence of a wavelength of 540 nm to 595 nm) upon irradiation with ultraviolet to near-ultraviolet excitation light of a wavelength of 300 to 440 nm or blue excitation light of a wavelength of 440 to 480 nm include CdSe nanocrystals having a particle size of about 3.3 nm to about 4.5 nm. Specific examples of quantum dot that produces red visible light (fluorescence of a wavelength of 600 nm to 700 nm) upon irradiation with ultraviolet to near-ultraviolet excitation light of a wavelength of 300 to 440 nm or blue excitation light of a wavelength of 440 to 480 nm include CdSe nanocrystals having a particle size of about 4.5 nm to about 10 nm.

(Method for Manufacturing Light-Emitting Device 1)

Next, a description will be given of an example of a method for manufacturing the light-emitting device 1.

[Preparation of Cell 10]

First, a cell 10 is prepared. The cell 10 can be produced by placing a sidewall member 13 formed of a frame-shaped glass plate between a first glass plate 11 and a second glass plate 12 and fusing the sidewall member 13 and the glass plates 11, 12 together. The fusion of the sidewall member 13 and the glass plates 11, 12 can be performed, for example, by irradiating them with laser beams.

[Reduction Step]

Next, prior to encapsulation of quantum dot 17 to be described hereinafter into the cell 10, a reduction step of reducing moisture adsorbed on the inside walls of the cell 10 is performed. Specifically, in this embodiment, the cell 10 is heated to or above 300° C. Thus, moisture adsorbed on the cell 10 is reduced.

The cell 10 is preferably heated while being internally reduced in pressure, such as by placing the cell 10 under a reduced-pressure atmosphere. By doing so, moisture adsorbed on the cell 10 can be more effectively removed. In the reduction step, the cell 10 may be internally reduced in pressure so that the internal pressure of the cell 10 preferably reaches $0.1 \times 10^5$ Pa or below and more preferably $0.01 \times 10^5$ Pa or below.

In addition, the reduction step is preferably performed under an inert gas atmosphere. Specifically, the reduction step is preferably performed, for example, under a dry nitrogen atmosphere or a dry argon atmosphere. Thus, the moisture concentration in the cell 10 can be reduced and the oxygen concentration in the cell 10 can also be reduced, so that the quantum dot can be more effectively prevented from being degraded.

After the cell is placed under a reduced-pressure atmosphere, the work of introducing dry gas, such as nitrogen or argon, into the cell and reducing the pressure in the cell again may be repeated several times. By doing so, the moisture concentration and oxygen concentration in the cell 10 can be more reduced.

[Encapsulation Step]

Next, quantum dot 17 is introduced through the connecting hole 15 into the cell 10 and the cell 10 is then sealed by closing the connecting hole 15 with a closure member 16. Thus, a light-emitting device 1 can be completed.

This encapsulation step is preferably performed, after the reduction step is performed, without exposure to the atmosphere. By doing so, the oxygen concentration and moisture concentration in the interior space 14 can be low.

The inventors have conducted intensive studies, resulting in the finding that that even when a cell made of glass is used as the cell for the light-emitting device in which quantum dot is used (where the "light-emitting device in which quantum dot is used" may be hereinafter referred to as a "quantum dot light-emitting device"), it is difficult to sufficiently increase the luminous efficiency of the light-emitting device. The reason for this is not clear but can be considered as follows. For example, in an organic electroluminescent device or the like, moisture having entered the device is consumed by reaction with an organic electroluminescent material or the like. Therefore, an organic electroluminescent device having a desired luminous efficiency can be achieved by, in consideration of partial degradation of the organic electroluminescent material due to moisture and so on present in the cell, previously providing a high concentration of the organic electroluminescent material. Unlike this, in the quantum dot light-emitting device, moisture in the cell can be assumed to remain unconsumed and continue to be present in the cell. It can be considered that for this reason the quantum dot light-emitting device has difficulty achieving a high luminous efficiency.

Based on the above new finding specific to the quantum dot light-emitting device, the inventors came up with the necessity to perform, prior to the encapsulation step, the reduction step of reducing moisture adsorbed on the inside walls of the cell 10. By performing the reduction step, adsorbed moisture on the inside walls of the cell 10 can be reduced. Thus, a high-luminous efficiency light-emitting device 1 can be achieved.

To more effectively reduce the adsorbed moisture on the inside walls of the cell 10, the cell 10 is preferably heated to or above 300°, more preferably heated to or above 350°, and still more preferably heated to or above 400°. The sidewall member 13 is preferably made of glass in order to match the coefficient of thermal expansion with that of the first and second glass plates 11, 12 to suppress deformation of the cell 10 due to the application of heat. Furthermore, the cell 10 is preferably heated while being internally reduced in pressure. Specifically, the cell 10 is preferably heated while internally reduced in pressure so that the internal pressure of the cell 10 reaches $0.1 \times 10^5$ Pa or below and more preferably heated while internally reduced in pressure so that the internal pressure of the cell 10 reaches $0.01 \times 10^5$ Pa or below.

In addition, the reduction step is preferably performed under an inert gas atmosphere. Furthermore, after the reduction step is performed, the introduction of the quantum dot is preferably performed without exposure to the atmosphere.

In this embodiment, the description has been given of an example where the cell 10 is first produced and the quantum dot 17 is then introduced into the cell 10. However, the present invention is not limited to this. For example, moisture adsorbed on the first and second glass plates and the sidewall member may be first reduced, quantum dot may be then placed on the first glass plate, and the second glass plate and the sidewall member may be then fused to the first glass plate to produce a cell. Alternatively, a tubular sidewall member may be first placed on the first glass plate and fused together to produce a container, moisture adsorbed on the produced container and the second glass plate may be then reduced, quantum dot may be then introduced into the container, and the second glass plate and the container may be then fused together to produce a cell. In other words, a cell may be produced after quantum dot is disposed. A cell may not necessarily be completed prior to the reduction step of reducing moisture adsorbed on the inside walls of the cell and may be produced after in the reduction step moisture adsorbed on the components of the cell is reduced.

REFERENCE SIGNS LIST

1 light-emitting device
10 cell
11 first glass plate
12 second glass plate
13 sidewall member
14 interior space
15 connecting hole
16 closure member
17 quantum dot

The invention claimed is:

1. A method for manufacturing a light-emitting device that includes a cell including first and second glass plates facing and spaced apart from each other and quantum dot encapsulated in the cell, the method comprising
a reduction step of, prior to the encapsulation of the quantum dot, reducing moisture adsorbed on inside walls of the cell.

2. The method for manufacturing a light-emitting device according to claim 1, wherein the cell is heated to or above 300° C. in the reduction step.

3. The method for manufacturing a light-emitting device according to claim 2, wherein in the reduction step the cell is heated to or above 300° C. while being internally reduced in pressure.

4. The method for manufacturing a light-emitting device according to claim 1, wherein the reduction step is performed under an inert gas atmosphere.

5. The method for manufacturing a light-emitting device according to claim 1, wherein after the reduction step is performed, the step of introducing the quantum dot into the cell is performed without exposure to the atmosphere.

6. The method for manufacturing a light-emitting device according to claim 1, wherein the cell further includes a glass-made sidewall member disposed between the first glass plate and the second glass plate.

7. The method for manufacturing a light-emitting device according to claim 6, wherein the cell is produced by fusing each of the glass plates to the sidewall member.

* * * * *